US010866017B2

(12) United States Patent
Matsuura et al.

(10) Patent No.: US 10,866,017 B2
(45) Date of Patent: Dec. 15, 2020

(54) CONDENSATION SUPPRESSING METHOD AND PROCESSING APPARATUS

(71) Applicant: Tokyo Electron Limited, Tokyo (JP)

(72) Inventors: Shin Matsuura, Miyagi (JP); Takuya Nishijima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 67 days.

(21) Appl. No.: 16/377,359

(22) Filed: Apr. 8, 2019

(65) Prior Publication Data

US 2019/0310002 A1 Oct. 10, 2019

(30) Foreign Application Priority Data

Apr. 9, 2018 (JP) .............................. JP2018-074621

(51) Int. Cl.
*F25B 47/00* (2006.01)
*H01L 23/34* (2006.01)

(52) U.S. Cl.
CPC ........ *F25B 47/006* (2013.01); *F25B 2700/02* (2013.01); *F25B 2700/13* (2013.01); *F25B 2700/2104* (2013.01); *H01L 23/34* (2013.01)

(58) Field of Classification Search
CPC ................ F25B 2700/02; F25B 47/006; F25B 2700/13; F25B 2700/2104; H01L 23/34
See application file for complete search history.

(56) References Cited

U.S. PATENT DOCUMENTS

| 5,504,040 | A | * | 4/1996 | Moslehi | ................... | B05D 1/60 |
| | | | | | | 257/E21.24 |
| 2003/0000102 | A1 | * | 1/2003 | Jones | ................ | H01L 21/67046 |
| | | | | | | 34/549 |
| 2013/0077651 | A1 | * | 3/2013 | Lee | ................... | H01L 21/67253 |
| | | | | | | 374/28 |

FOREIGN PATENT DOCUMENTS

JP H07-169737 A 7/1995

* cited by examiner

*Primary Examiner* — David J Teitelbaum
(74) *Attorney, Agent, or Firm* — Pearne & Gordon LLP

(57) ABSTRACT

A processing apparatus includes a first temperature measuring unit configured to measure a surface temperature of a first member exposed in a first closed space, a supply line configured to supply a low-dew point gas into the first closed space and a control unit configured to control a flow rate of the low-dew point gas. The control unit performs a first process to a third process. In the first process, an absolute humidity of a gas within the first closed space at a position of a surface of the first member is specified for the flow rate of the low-dew point gas. In the second process, a saturated absolute humidity at the surface temperature of the first member is specified. In the third process, the flow rate of the low-dew point gas is controlled based on the absolute humidity of the gas and the saturated absolute humidity.

7 Claims, 7 Drawing Sheets

CONDENSATION SUPPRESSING METHOD AND PROCESSING APPARATUS

CROSS-REFERENCE TO RELATED APPLICATION

This application claims the benefit of Japanese Patent Application No. 2018-074621 filed on Apr. 9, 2018, the entire disclosures of which are incorporated herein by reference.

TECHNICAL FIELD

The various aspects and embodiments described herein pertain generally to a condensation suppressing method and a processing apparatus.

BACKGROUND

In a processing apparatus configured to perform a preset processing on a semiconductor wafer by using plasma, the semiconductor wafer is regulated to have a predetermined temperature. Since the semiconductor wafer is heated by the plasma, the semiconductor wafer needs to be cooled to maintain the temperature of the semiconductor wafer at the predetermined temperature in the process using the plasma. By way of example, by allowing a coolant having a temperature lower than a room temperature to be flown within a placing table on which the semiconductor wafer is placed, the semiconductor wafer is cooled through the placing table.

Since, however, a temperature of the placing table falls below the room temperature due to the coolant flown therein, condensation may occur at a portion of the placing table which is in contact with exterior air. Further, even another component in contact with the placing table may be deprived of heat by the placing table and a temperature of that component may fall under the room temperature. This component may also suffer the condensation at a portion thereof which is in contact with the exterior air. If the condensation takes place in the processing system, an electrical component may break down due to moisture generated by the condensation.

To avoid this problem, there is known a technique of suppressing the condensation by protecting, with a thermal insulator, a surface of the component which might suffer from the condensation or through heating the component by a heating device such as a heater (see, for example, Patent Document 1).

Patent Document 1: Japanese Patent Laid-open Publication No. H07-169737

If, however, the component the temperature of which falls below the room temperature is heated, the heat may be transferred to the coolant via the corresponding component, resulting in degradation of cooling performance by the coolant. Further, in case of suppressing the condensation by using the thermal insulator or the heating device, a space for accommodating the thermal insulator or the heating device is required. Thus, it may be difficult to achieve scale-down of a processing apparatus.

SUMMARY

In an exemplary embodiment, there is provided a condensation suppressing method in a processing apparatus configured to process a processing target object. The processing apparatus includes a first temperature measuring unit, a supply line and a control unit. The first temperature measuring unit is configured to measure a surface temperature of a first member exposed in a first closed space provided in the processing apparatus. The supply line is configured to supply a low-dew point gas having a dew point temperature lower than that of air outside the processing apparatus into the first closed space. The control unit is configured to control a flow rate of the low-dew point gas supplied into the first closed space. The control unit performs a first process, a second process and a third process. In the first process, an absolute humidity of a gas within the first closed space at a position of a surface of the first member is specified for the flow rate of the low-dew point gas. In the second process, a saturated absolute humidity at the surface temperature of the first member measured by the first temperature measuring unit is specified. In the third process, the flow rate of the low-dew point gas is controlled based on the absolute humidity of the gas within the first closed space at the position of the surface of the first member and the saturated absolute humidity at the surface temperature of the first member.

According to the exemplary embodiment, it is possible to suppress the condensation on the members of the processing apparatus while reducing the consumption amount of the low-dew point gas.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
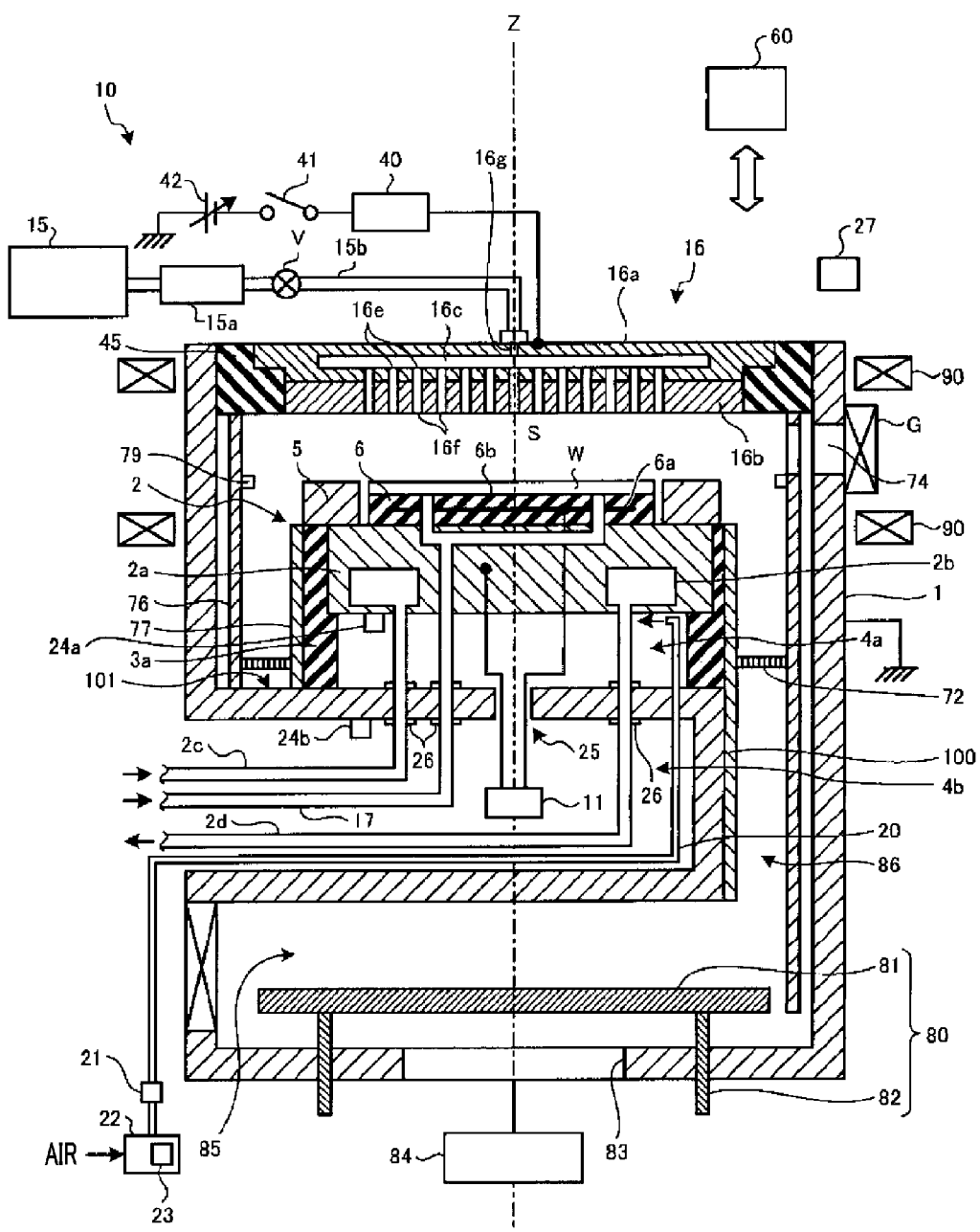
FIG. 1 is a schematic cross sectional view illustrating an example of a processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a condensation suppressing method and a processing apparatus according to an exemplary embodiment will be described in detail with reference to the accompanying drawings. However, it should be noted that the condensation suppressing method and the processing apparatus of the present disclosure are not limited to the exemplary embodiment to be described below.

[Configuration of Processing Apparatus 10]

FIG. 1 is a schematic cross sectional view illustrating an example of a processing apparatus 10. The processing apparatus 10 according to the present exemplary embodiment is configured as, for example, a capacitively coupled parallel plate type plasma etching apparatus. The processing apparatus 10 is equipped with a chamber 1 which is made of, for example, aluminum having an anodically oxidized surface, and has a substantially cylindrical space therein. The chamber 1 is frame-grounded. A central axis of the substantially cylindrical space formed by an inner sidewall of the chamber 1 will be defined as Z-axis.

A substantially cylindrical exhaust opening 83 is formed at a bottom of the chamber 1. A supporting base 100 configured to support the placing table 2 from below is provided above the exhaust opening 83. The supporting base 100 is supported by a plurality of supporting beams 101 elongated in a direction approaching the Z-axis from the inner sidewall of the chamber 1. In the present exemplary embodiment, each supporting beam 101 is elongated from the inner sidewall of the chamber 1 toward the Z-axis in a direction perpendicular to the Z-axis. Further, the supporting base 100 and the respective supporting beams 101 are made of the same material as that of the chamber 1.

Figure 2:
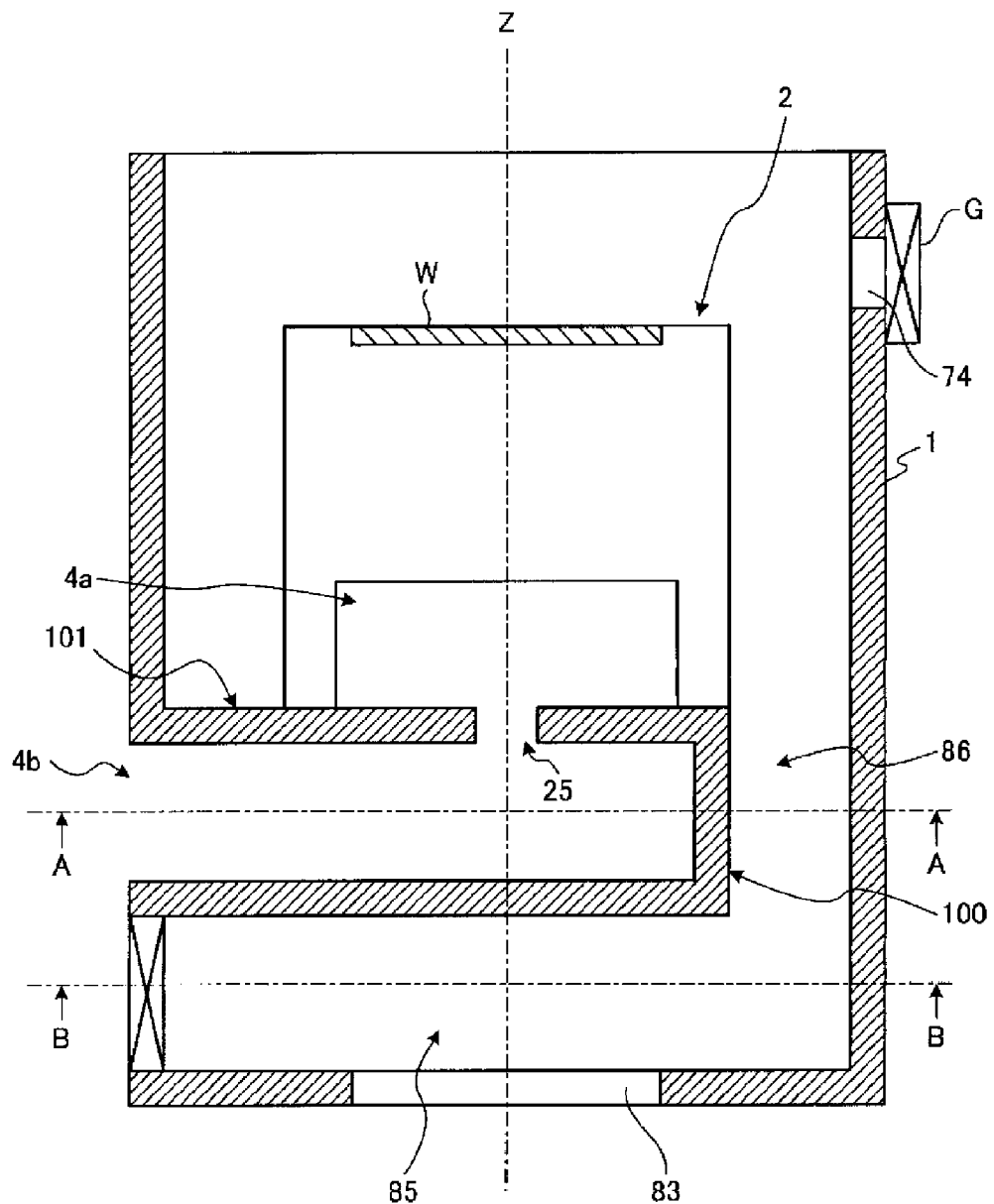
FIG. 2 is a cross sectional view schematically illustrating an example of a positional relationship between a chamber and a placing table.
Figure 3:
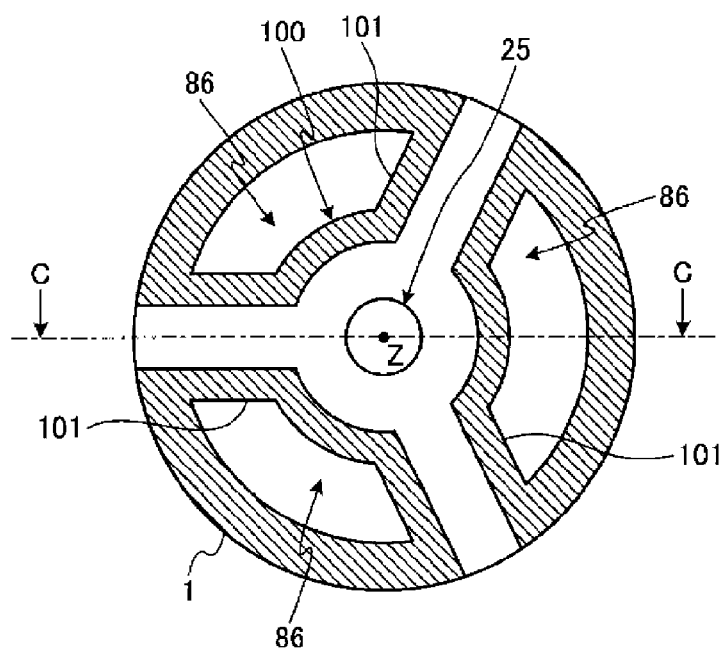
FIG. 3 is a cross sectional view illustrating an example of a cross section of the chamber taken along a line A-A of FIG. 2.
Figure 4:
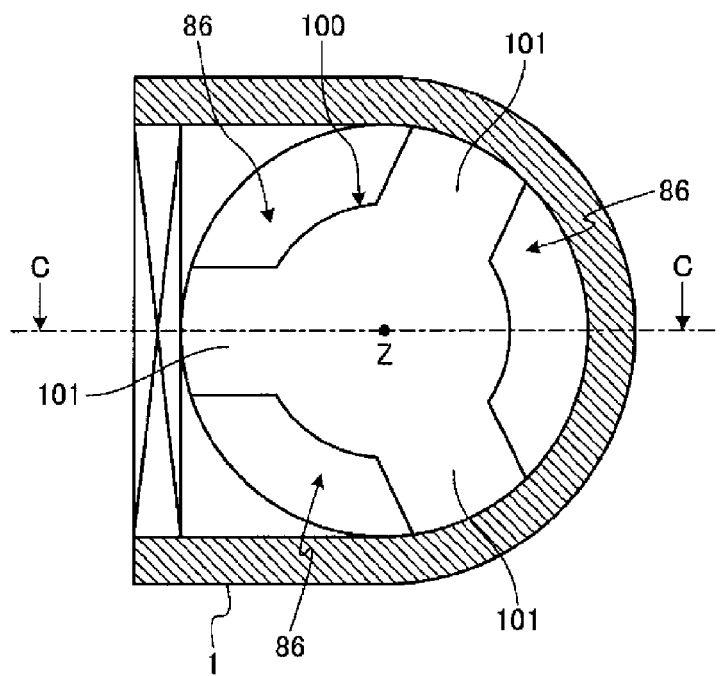
FIG. 4 is a cross sectional view illustrating an example of a cross section of the chamber taken along a line B-B of FIG. 2.

FIG. 2 is a diagram schematically illustrating a positional relationship between the chamber 1 and the placing table 2. FIG. 3 is a cross sectional view showing an example of a cross section of the chamber 1 taken along a line A-A of FIG. 2. FIG. 4 is a cross sectional view showing an example of a cross section of the chamber 1 taken along a line B-B of FIG. 2. A cross section of the chamber 1 taken along a line C-C in each of FIG. 3 and FIG. 4 corresponds to the cross section of FIG. 2.

By way of example, as depicted in FIG. 2, in the processing apparatus 10 according to the present exemplary embodiment, a central axis of a semiconductor wafer W placed on the placing table 2, a central axis of the inner sidewall of the chamber 1, a central axis of an outer sidewall of the placing table 2 and a central axis of the exhaust opening 83 are substantially coincident. The placing table 2 is supported from below by the supporting base 100, and the supporting base 100 is supported by the plurality of supporting beams 101 elongated in the direction approaching the Z-axis from the inner sidewall of the chamber 1, as shown in FIG. 3 and FIG. 4, for example. In the present exemplary embodiment, the supporting beams 101 are elongated from the inner sidewall of the chamber 1 in the direction perpendicular to the Z-axis. By way of example, the supporting beams 101 are arranged axisymmetrically with respect to the Z-axis, as shown in FIG. 3 and FIG. 4. That is, a line which passes through a center of the layout of the supporting beams 101 coincides with the Z-axis. Furthermore, in the present exemplary embodiment, the supporting base 100 is supported by, e.g., three supporting beams 101, as shown in FIG. 3 and FIG. 4. Since the three supporting beams 101 are arranged axisymmetrically with respect to the Z-axis, every two neighboring supporting beams 101 form an angle of 120 degrees with respect to the Z-axis, when viewed from a direction according to the Z-axis.

An exhaust path 86 formed around the placing table 2 communicates with an exhaust space 85 under the supporting base 100 through a space between the two neighboring supporting beams 101. Since the supporting beams 101 are axisymmetrically arranged with respect to the Z-axis, the spaces between every two neighboring supporting beams 101 are also axisymmetrically formed with respect to the Z-axis, as shown in FIG. 3 and FIG. 4, for example.

In the present exemplary embodiment, the placing table 2 has a substantially cylindrical shape and placed within the chamber 1 such that the central axis of the outer sidewall of the placing table 2 coincides with the Z-axis. The placing table 2 is equipped with a lower electrode 2a, a focus ring (FR) 5 and an electrostatic chuck (ESC) 6. The lower electrode 2a is formed of, by way of non-limiting example, aluminum, and has a substantially cylindrical shape.

The ESC 6 is provided on a top surface of the lower electrode 2a. The ESC 6 is configured to attract and hold the semiconductor wafer W as an example of a processing target object by an electrostatic force, and has a structure in which an electrode 6a formed of a conductive film is embedded between a pair of insulating layers or insulating sheets. The electrode 6a is electrically connected to a power circuit 11. The semiconductor wafer W has a substantially circular plate shape, and is placed on a top surface 6b of the ESC 6 such that a central axis thereof coincides with the Z-axis. The semiconductor wafer W is attracted to and held on the top surface 6b of the ESC 6 with the electrostatic force generated by a DC voltage supplied from the power circuit 11.

The FR 5 is provided around the ESC 6 on the top surface of the lower electrode 2a to surround the semiconductor wafer W on the ESC 6. The FR 5 is made of, by way of non-limiting example, single-crystalline silicon. The FR 5 improves uniformity of a plasma processing such as etching on the surface of the semiconductor wafer W. The lower electrode 2a and the FR 5 are supported by a substantially cylindrical inner wall member 3a made of, by way of example, but not limitation, quartz. Further, an outer sidewall of the lower electrode 2a is covered by the inner wall member 3a.

A path 2b having, for example, an annular shape is formed within the lower electrode 2a. A coolant having a temperature lower than a room temperature is supplied into and circulated through the path 2b from a non-illustrated external chiller unit via a pipeline 2c and a pipeline 2d. Temperature of the lower electrode 2a, the FR 5 and the ESC 6 are adjusted by the coolant circulated within the path 2b, so that the semiconductor wafer W on the ESC 6 is controlled to a preset temperature. A temperature of the coolant supplied from the chiller unit is equal to or less than, e.g., 0° C.

The temperature of the coolant supplied from the chiller unit may be, by way of example, −70° C. A target temperature of the semiconductor wafer W is selected based on processing conditions, and may be set differently for each stage of the processing. That is, the temperature of the coolant supplied from the chiller unit may be changed for each stage or during the stage.

A heat transfer gas such as, but not limited to, a He gas is supplied via a pipeline 17 into a gap between the top surface 6b of the ESC 6 and a bottom surface of the semiconductor wafer W from a non-illustrated gas supply device.

The power circuit 11 is equipped with a DC power supply, a first high frequency power supply, a first matching device, a second high frequency power supply and a second matching device. A DC voltage supplied from the DC power supply is applied to the electrode 6a of the ESC 6. The first high frequency power supply generates a high frequency power having a preset frequency (e.g., 100 MHz) for plasma generation. Further, the second high frequency power supply generates, as a high frequency power having a preset frequency for ion attraction (bias), a high frequency power having a frequency (e.g., 13 MHz) lower than the frequency of the high frequency power generated by the first high frequency power supply. The high frequency power generated by the first high frequency power supply is applied to the lower electrode 2a via the first matching device, and the high frequency power generated by the second high frequency power supply is applied to the lower electrode 2a via the second matching device.

Around the placing table 2, the exhaust path 86 is formed to surround the placing table 2. Within the exhaust path 86, a baffle plate 72 having a multiple number of through holes is provided to surround the placing table 2. Within the exhaust path 86, the baffle plate 72 is located at a position under the ESC 6 and above the supporting beams 101. The exhaust path 86 communicates with the exhaust space 85 formed below the supporting base 100 through the spaces between the neighboring supporting beams 101.

The exhaust opening 83 is formed at the bottom of the chamber 1 to have a substantially circular shape, and a central axis of the exhaust opening 83 coincides with the Z-axis. An exhaust device 84 is connected to the exhaust opening 83. The exhaust device 84 has a vacuum pump such as, but not limited to, a turbo molecular pump, and is configured to exhaust the inside of the chamber 1 to a required vacuum degree. Further, an APC (Automatic Pressure Control) 80 is provided at the exhaust opening 83. The APC 80 has a cover body 81 and supporting rods 82. The cover body 81 is a substantially circular plate-shaped body, and is provided above the exhaust opening 83 such that a central axis of the cover body 81 coincides with the Z-axis. Further, the cover body 81 is placed to be substantially parallel with an opening surface of the exhaust opening 83. A diameter of the cover body 81 is larger than a diameter of the opening of the exhaust opening 83.

By adjusting a height of the cover body 81, the supporting rods 82 are capable of controlling exhaust conductance of a gap formed between the cover body 81 and the surface of the chamber 1 around the exhaust opening 83. Though two supporting rods 82 are depicted in FIG. 1, three or more supporting rods 82 may be provided to surround the exhaust opening 83. By adjusting the height of the cover body 81 with the supporting rods 82, the APC 80 is capable of adjusting an internal pressure of the chamber 1 within a preset range.

Provided under the lower electrode 2a is a first closed space 4a which is surrounded by the inner wall member 3a and the supporting base 100. Placed within the first closed space 4a are the pipeline 2c, the pipeline 2d, the pipeline 17, wirings configured to connect the power circuit 11 to the lower electrode 2a and the ESC 6, and so forth. Besides, a filter configured to remove an unnecessary frequency component in the power supplied to the lower electrode 2a and the ESC 6 from the power circuit 11 is also provided within the first closed space 4a. Furthermore, the first closed space 4a serves as a retreat space into which pusher pins for carrying the semiconductor wafer W in and out are retreated.

Moreover, a temperature sensor 24a is also provided within the first closed space 4a. The temperature sensor 24a is an example of a first temperature measuring unit. The temperature sensor 24a is configured to measure a surface temperature of a member, which becomes to have the lowest temperature, of the members exposed in the first closed space 4a. In the present exemplary embodiment, the temperature sensor 24a measures a surface temperature of the pipeline 2c through which the coolant is supplied to the lower electrode 2a. Since the various members are placed within the first closed space 4a, it may be difficult to obtain a space for winding an insulator around the pipelines 2c and 2d in which the coolant, whose temperature is lower than the room temperature, is flown.

Furthermore, it may be considered to use a vacuum double pipeline as the pipelines 2c and 2d. Since, however, the vacuum double pipeline is thicker than a typical pipeline, it is difficult to allow the pipelines 2c and 2d to have the vacuum double pipeline within the first closed space 4a having a limited space for accommodating the pipelines 2c and 2d. For the reason, the pipelines 2c and 2d are made of a typical metal pipe. Therefore, surface temperatures of the pipelines 2c and 2d fall below the room temperature depending on the temperature of the coolant.

In addition, the coolant having a temperature slightly increased from the temperature of the coolant flowing in the pipeline 2c flows within the pipeline 2d due to a heat exchange with the lower electrode 2a. Therefore, the surface temperature of the pipeline 2d is slightly higher than the surface temperature of the pipeline 2c. Thus, the temperature sensor 24a according to the present exemplary embodiment measures, as the surface temperature of the member, which becomes to have the lowest temperature, of the members exposed in the first closed space 4a, the surface temperature of the pipeline 2c through which the coolant is supplied to the lower electrode 2a. The pipeline 2c is an example of a first member.

Further, dry air is supplied into the first closed space 4a via a supply line 20. The dry air is an example of the low-dew point gas whose dew-point temperature is lower than that of the exterior air outside the processing apparatus 10. The dry air supplied into the first closed space 4a via the supply line 20 is generated by a dryer 22. The dryer 22 generates the dry air by removing, with the hollow fiber membrane, moisture from air supplied into a room (for example, clean room) in which the processing apparatus 10 is provided. A sensor 23 is configured to measure a temperature and a humidity of the dry air generated by the dryer 22. A flow rate Q of the dry air generated by the dryer 22 to be supplied into the first closed space 4a via the supply line 20 is controlled by a flow rate controller 21. The flow rate controller 21 is controlled by a control unit 60 to be described later. Further, air which is already free of moisture may be supplied as the dry air from a factory equipment or a bomb without passing through the dryer 22. In case that the dry air is supplied from the factory equipment, information upon the temperature and the humidity of the dry air supplied from the factory equipment may be used as the temperature and the humidity of the dry air without needing to use the sensor 23. Furthermore, for the purpose of suppressing condensation, the gas may not be limited to the air, and oxygen or an inert gas such as nitrogen or a rare gas may be used as long as a mixing ratio of the gas and the moisture is low. In consideration of an effect on the human body, however, it is desirable that the gas has a mixing ratio in which proportions of gas components except the moisture included in the dry air or the air supplied into the room (for example, clean room) where the processing apparatus 10 is provided are substantially same (e.g., nitrogen: about 80%, oxygen: about 20%).

A second closed space 4b is formed within the supporting base 100 and the supporting beams 101. The second closed space 4b communicates with an opening formed at a sidewall of the chamber 1. Further, the second closed space 4b communicates with the first closed space 4a through an opening 25 formed at an upper portion of the supporting base 100. Accordingly, the dry air supplied into the first closed space 4a via the supply line 20 flows into the second closed space 4b through the opening 25, and is exhausted to the outside of the processing apparatus 10 from the opening formed at the sidewall of the chamber 1.

A part of the pipeline 2c and a part of the pipeline 2d are located within the second closed space 4b. One ends of the pipelines 2c and 2d are connected to the chiller unit provided at the outside of the processing apparatus 10, and the other ends of the pipelines 2c and 2d are connected to the upper portion of the supporting base 100 via connecting members 26. The connecting members 26 are, for example, flanges of the pipelines. A part of the pipeline 17 is also placed within the second closed space 4b. One end of the pipeline 17 is connected to a gas supply source provided at the outside of the processing apparatus 10, and the other end of the pipeline 17 is connected to the upper portion of the supporting base 100 via a connecting member 26. In the example shown in FIG. 1, the pipeline 2c, the pipeline 2d and the pipeline 17 are connected to the external devices outside the chamber 1 via one of the three supporting beams 101. However, each of the pipelines may be connected to the corresponding external device outside the chamber 1 via the corresponding one of the supporting beams 101 individually.

Further, the power circuit 11 is placed within the second closed space 4b. Also provided within the second closed space 4b are, besides the power circuit 11, a driving mechanism for the pusher pins, the filter configured to remove the unnecessary frequency component from the power supplied to the lower electrode 2a and the ESC 6 from the power circuit 11, and so forth. A temperature sensor 24b is also provided within the second closed space 4b. The temperature sensor 24b is an example of a second temperature measuring unit. The temperature sensor 24b measures a surface temperature of a member, which becomes to have the lowest temperature, of the members exposed in the second closed space 4b. In the present exemplary embodiment, the temperature sensor 24b measures a surface temperature of the connecting member 26 of the pipeline 2c.

Here, since the second closed space 4b is larger than the first closed space 4a, vacuum double pipeline may be used as each of the pipelines 2c and 2d. In each of the pipelines 2c and 2d, however, insulation effect is lowered at the connecting member 26 which is connected to the upper portion of the supporting base 100. For this reason, in each of the pipelines 2c and 2d, the temperature of the surface of the connecting member 26 becomes lower than the room temperature depending on the temperature of the coolant. Therefore, the temperature sensor 24b according to the present exemplary embodiment measures the surface temperature of the connecting member 26 of the pipeline 2c as the surface temperature of the member, which becomes to have the lowest temperature, of the members exposed in the second closed space 4b. The connecting member 26 of the pipeline 2c is an example of a second member.

An opening 74 is formed at a sidewall of the chamber 1 above the ESC 6, and the opening 74 is opened or closed by a gate valve G. A deposition shield 76 and a deposition shield 77 are respectively provided along the inner sidewall of the chamber 1 and an outer sidewall of the placing table 2 in a detachable manner. The deposition shields 76 and 77 are configured to suppress a deposit from adhering to the inner sidewall of the chamber 1. Further, a conductive member (GND block) 79, which is DC-connected to the ground, is provided at a position of the deposition shield 76 which is substantially on a level with the semiconductor wafer W attracted to and held on the ESC 6. The GND block 79 is configured to suppress an abnormal discharge within the chamber 1.

An upper electrode 16 is provided above the lower electrode 2a, facing the placing table 2. The lower electrode 2a and the upper electrode 16 are provided within the chamber 1 to be substantially parallel to each other. In the following, a space between the semiconductor wafer W placed on the ESC 6 and a bottom surface of the upper electrode 16 will be referred to as a processing space S.

The upper electrode 16 is supported at an upper portion of the chamber 1 with an insulating member 45 therebetween. The upper electrode 16 has a ceiling plate supporting member 16a and an upper ceiling plate 16b. The ceiling plate supporting member 16a is formed of, by way of example, aluminum having an anodically oxidized surface, and supports the upper ceiling plate 16b in a detachable manner. The upper ceiling plate 16b is made of a silicon-containing material such as, but not limited to, quartz.

A gas diffusion space 16c is provided within the ceiling plate supporting member 16a. The gas diffusion space 16c has a substantially cylindrical shape, and, desirably, a central axis of the gas diffusion space 16c coincides with the Z-axis. A multiple number of gas through holes 16e are formed in a bottom portion of the ceiling plate supporting member 16a to be located under the gas diffusion space 16c. These gas through holes 16e are formed under the gas diffusion space 16c concentrically around the Z-axis at a substantially regular distance therebetween.

Gas through holes 16f are formed through the upper ceiling plate 16b in a thickness direction thereof. These gas through holes 16f are formed at the upper ceiling plate 16b concentrically around the Z-axis at a substantially regular distance therebetween. Each gas through hole 16f communicates with a corresponding one of the gas through holes 16e. The processing gas supplied into the gas diffusion space 16c is diffused and supplied into the chamber 1 in a shower shape through the gas through holes 16e and 16f. Further, since the gas through holes 16e and 16f are arranged concentrically around the Z-axis at the substantially regular distance, the processing gas supplied into the chamber 1 through the gas through holes 16e and 16f is introduced into the processing space S at a substantially same flow rate in a circumferential direction around the Z-axis.

Furthermore, a temperature control device such as a non-illustrated heater or a non-illustrated pipeline for circulating a coolant is provided at the ceiling plate supporting member 16a or the like. Therefore, the upper electrode 16 can be controlled to have a temperature within a required range during the processing of the semiconductor wafer W.

The ceiling plate supporting member 16a of the upper electrode 16 is provided with a gas inlet opening 16g through which the processing gas is introduced into the gas diffusion space 16c. It is desirable that a central axis of the gas inlet opening 16g coincides with the Z-axis. One end of a pipeline 15b is connected to this gas inlet opening 16g. The other end of the pipeline 15b is connected via a valve V and a mass flow controller (MFC) 15a to a gas supply source 15 which is configured to supply the processing gas for the processing of the semiconductor wafer W. The processing gas supplied from the gas supply source 15 is introduced into the gas diffusion space 16c via the pipeline 15b, and then, is diffused and supplied into the chamber 1 in a shower shape through the gas through holes 16e and 16f.

In the present exemplary embodiment, the processing gas is supplied into the chamber 1 through the gas through holes 16e and 16f which are concentrically formed at the upper electrode 16 to be equi-spaced around the Z-axis which passes through the center of the semiconductor wafer W placed on the placing table 2. Further, a central axis of the substantially cylindrical space formed by the inner sidewall of the chamber 1, the central axis of the placing table 2, a central axis of the exhaust opening 83 and the line passing through the center of the layout of the supporting beams 101 substantially coincide with the Z-axis. Furthermore, the exhaust path 86 formed around the placing table 2 communicates with the exhaust space 85 via the spaces between every two adjacent supporting beams 101 which are axisymmetric with respect to the Z-axis. Thus, a flow of the gas exhausted from the exhaust opening 83 after being supplied from the upper electrode 16 is axisymmetric with respect to the Z-axis which passes through the center of the semiconductor wafer W placed on the placing table 2. Therefore, non-uniformity in the flow of the gas within the chamber 1 in the circumferential direction of the semiconductor wafer W placed on the placing table 2 can be reduced, so that uniformity of the processing upon the semiconductor wafer W within the surface thereof can be improved.

The upper electrode 16 is electrically connected, via a low pass filter (LPF) 40 and a switch 41, to a variable DC power supply 42 configured to output a negative DC voltage. The switch 41 is configured to control a supply and a stop of the supply of the DC voltage to the upper electrode 16 from the variable DC power supply 42. By way of example, when plasma is generated in the processing space S within the chamber 1 as the high frequency powers are supplied to the lower electrode 2a from the power circuit 11, the switch 41 is turned on, if necessary, so that the negative DC voltage having a preset magnitude is applied to the upper electrode 16.

Further, ring magnets 90 are concentrically disposed around the chamber 1. The ring magnets 90 form a magnetic field in the processing space S between the upper electrode 16 and the placing table 2. The ring magnets 90 are configured to be rotatable by a non-illustrated rotating device. Further, a sensor 27 configured to measure a temperature and a humidity of the air within the room (for example, clean room) in which the processing apparatus 10 is provided is provided at the outside of the processing apparatus 10.

An overall operation of the processing apparatus 10 configured as stated above is controlled by the control unit 60. The control unit 60 has a processor, a memory and an input/output interface. The memory stores therein a program to be executed by the processor and a recipe including various processing conditions. The processor executes the program read out from the memory, and controls the individual components of the processing apparatus 10 through the input/output interface based on the recipe stored in the memory. The processing apparatus 10 controls, by way of example, the power circuit 11, the switch 41, the variable DC power supply 42, the valve V, the MFC 15a, the chiller unit, and so forth. Further, by way of example, the processing apparatus 10 acquires the temperature information from the temperature sensor 24a and the temperature sensor 24b respectively and acquires the information upon the temperature and the humidity from the sensor 23 and the sensor 27. The control unit 60 controls the flow rate controller 21 based on the acquired information, thus controlling the flow rate of the dry air supplied into the first closed space 4a via the supply line 20.

To perform the processing on the semiconductor wafer W by using plasma in the processing apparatus 10, the control unit 60 performs the following control over the processing apparatus 10. First, the control unit 60 supplies the processing gas of a preset flow rate into the gas diffusion space 16c by controlling the valve V and the MFC 15a in the state that the semiconductor wafer W is placed on the ESC 6. The processing gas supplied into the gas diffusion space 16c is diffused and introduced into the chamber 1 in a shower shape through the gas through holes 16e and 16f. Further, the control unit 60 operates the exhaust device 84. Then, by controlling the exhaust conductance while controlling the APC 80, the control unit 60 controls the inside of the chamber 1 to have a preset pressure.

Then, the control unit 60 controls the power circuit 11 to generate the high frequency powers of preset frequencies and apply the generated high frequency powers to the lower electrode 2a. Further, the control unit 60 controls the switch 41 to be turned on, thus allowing the DC voltage to be applied to the upper electrode 16. As a result, the plasma of the processing gas is generated in the processing space S between the semiconductor wafer W on the ESC 6 and the upper electrode 16. The processing such as etching is performed on the semiconductor wafer W on the ESC 6 by ions or radicals included in the plasma generated in the processing space S.

[Calculation Model]

Figure 5:
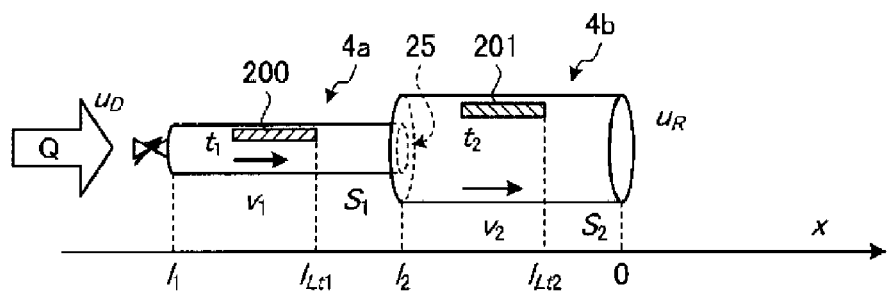
FIG. 5 is a diagram for describing an example of a model used in calculating distribution of an absolute humidity.

Now, an example of a calculating method of distribution of an absolute humidity (water vapor density) within the first closed space 4a and the second closed space 4b when the dry air is supplied into the first closed space 4a will be explained. FIG. 5 is a diagram for describing an example of a model used in calculating the distribution of the absolute humidity.

In the model shown in FIG. 5, the first closed space 4a and the second closed space 4b are substantially cylindrical spaces. Further, with a boundary between the second closed space 4b and a space outside the processing apparatus 10 as a reference (x=0), a direction in which the dry air flows is defined as x-axis. Further, a length of the first closed space 4a in the x-axis direction is defined as ($l_1-l_2$), and a length of the second closed space 4b in the x-axis direction is defined as $l_2$. The first closed space 4a and the second closed space 4b communicate with each other through the opening 25 formed at a position of $x=l_2$.

In FIG. 5, $S_1$ shows a cross sectional area of the first closed space 4a in the x-axis direction, and $S_2$ indicates a cross sectional area of the second closed space 4b in the x-axis direction. Further, $l_{Lt1}$ refers to an x coordinate of a member 200 which becomes to have the lowest temperature in the first closed space 4a, and $l_{Lt2}$ refers to an x coordinate of a member 201 which becomes to have the lowest temperature in the second closed space 4b. Furthermore, $t_1$ denotes a temperature of the member 200 when $x=l_{Lt1}$, and $t_2$ denotes a temperature of the member 201 when $x=l_{Lt2}$. In addition, $u_D$ indicates an absolute humidity of the dry air, and $u_R$ indicates an absolute humidity of the air outside the processing apparatus 10. Further, $v_1$ refers to a flow velocity of the dry air flowing in the first closed space 4a, and $v_2$ denotes a flow velocity of the dry air flowing in the second closed space 4b. The flow rate Q of the dry air supplied into the first closed space 4a may be represented by $Q=S_1v_1=S_2v_2$.

An absolute humidity at a position x will be referred to as $u(x)$, and it is assumed that water vapor in each of the first closed space 4a and the second closed space 4b is moved due to advection by the flow of the dry air and diffusion within each space. Thus, the absolute humidity $u(x)$ within the space may be represented by the following Expression (1) by using a transport diffusion equation (stationary solution).

[Expression 1]

$$v \frac{du}{dx} = D \frac{d^2u}{dx^2} \quad (1)$$

In this expression (1), v denotes the flow velocity of the dry air, and D represents a diffusion coefficient of the water vapor.

Further, the first closed space 4a and the second closed space 4b communicate with each other through the opening 25 when $x=l_2$. Thus, if the absolute humidity within the first closed space 4a is defined as $u_1(x)$ and the absolute humidity within the second closed space 4b is defined as $u_2(x)$, a boundary condition depicted in the following Expression (2) is satisfied.

[Expression 2]

$$\left. \begin{array}{l} u_1(l_1) = u_D \\ u_2(0) = u_R \end{array} \right\} \quad (2)$$

Furthermore, since a variation of the absolute humidity is continuously differentiable (smooth) at the position $(x=l_2)$ where the cross sectional area is changed, a continuity condition described in the following Expression (3) is satisfied.

[Expression 3]

$$\left. \begin{array}{l} u_1(l_2) = u_2(l_2) \\ \frac{d}{dx}u_1(l_2) = \frac{d}{dx}u_2(l_2) \end{array} \right\} \quad (3)$$

Based on the boundary condition of the Expression (2) and the continuity condition of the Expression (3), the transfer diffusion equation of the Expression (1) can be calculated as the following Expression (4).

[Expression 4]

$$u(x) = \left\{ \begin{array}{ll} \dfrac{(u_D - u_R)\left(\exp\left(Pe_1 \dfrac{x - l_2}{l_1 - l_2}\right) - \exp(Pe_1)\right)}{1 - \eta - \exp(Pe_1) + \eta\exp(-Pe_2)} + u_R & (l_1 \le x < l_2) \\ \dfrac{\eta(u_D - u_R)\left(\exp\left(Pe_2 \dfrac{x}{l_2}\right) - 1\right)}{(1 - \eta - \exp(Pe_1))\exp(Pe_2) + \eta} + u_R & (l_2 \le x \le 0) \end{array} \right\} \quad (4)$$

In the Expression (4), a Péclet number ($Pe_1$) of the first closed space 4a, a Péclet number ($Pe_2$) of the second closed space 4b and a flow rate ratio ($\eta$) are defined by the following expression (5).

[Expression 5]

$$\left. \begin{array}{l} Pe_1 := \dfrac{v_1}{D}(l_1 - l_2) \\ Pe_2 := \dfrac{v_2}{D}l_2 \\ \eta := \dfrac{v_1}{v_2} \end{array} \right\} \quad (5)$$

Figure 6:
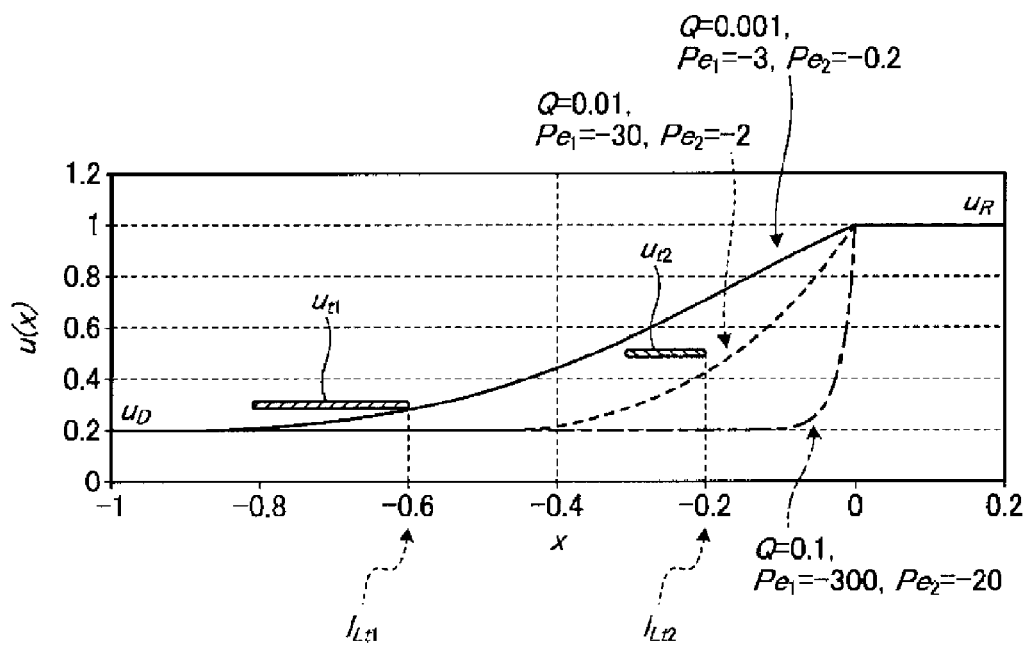
FIG. 6 is a diagram showing an example of a calculation result of the absolute humidity.
Figure 7:
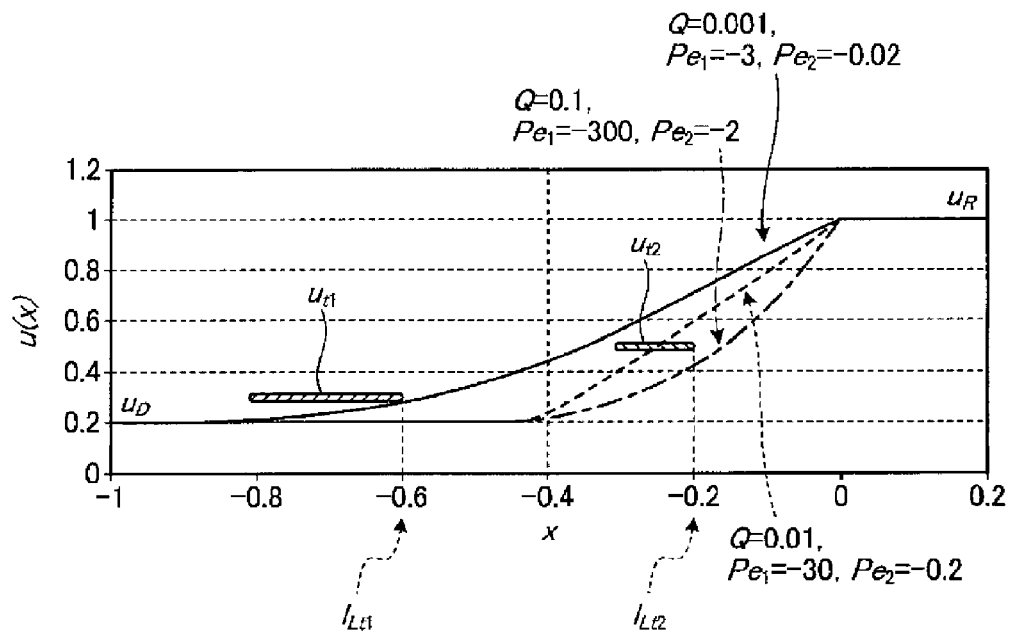
FIG. 7 is a diagram showing an example of a calculation result of the absolute humidity.

FIG. 6 and FIG. 7 are diagrams illustrating examples of calculation results of the absolute humidity $u(x)$. FIG. 6 shows a calculation result of the absolute humidity $u(x)$ when $v_1/v_2=S_2/S_1=10$. FIG. 7 shows a calculation result of the absolute humidity $u(x)$ when $v_1/v_2=S_2/S_1=100$. In FIG. 6 and FIG. 7, $u_{t1}$ indicates a saturated absolute humidity calculated from the surface temperature $t_1$ of the member 200 when $x=l_{Lt1}$, and $u_{t2}$ indicates a saturated absolute humidity calculated from the surface temperature $t_2$ of the member 201 when $x=l_{Lt2}$. Further, in FIG. 6 and FIG. 7, $l_{Lt2}$ equals −0.2; $l_2$ equals −0.4; $l_{Lt1}$ equals −0.6, and $l_1$ equals −1 ($l_{Lt2}$=−0.2, $l_2$=−0.4, $l_{Lt1}$=−0.6, and $l_1$=−1).

For example, as shown in FIG. 6, if Q equals 0.001, $Pe_1$ equals −3 and $Pe_2$ equals −0.2 (Q=0.001, $Pe_1$=−3, $Pe_2$=−0.2) when $v_1/v_2=S_2/S_1=10$, the absolute humidity $u(x)$ at a condition of $x<l_{Lt1}$ is lower than the saturated absolute humidity $u_{t1}$. Therefore, no condensation occurs on the member 200. Meanwhile, an absolute humidity $u(l_{Lt2})$ when $x=l_{Lt2}$ is higher than the saturated absolute humidity $u_{t2}$. In the example of FIG. 6, the absolute humidity $u(x)$ is found to be higher than the saturated absolute humidity $u_{t2}$ at any position of the member 201. Therefore, if Q equals 0.001, $Pe_1$ equals −3 and $Pe_2$ equals −0.2 (Q=0.001, $Pe_1$=−3, $Pe_2$=−0.2) when $v_1/v_2=S_2/S_1=10$, the condensation occurs on the member 201 though no condensation occurs on the member 200.

As another example, if a condition of Q=0.01, $Pe_1$=−30, $Pe_2$=−2 is set by increasing the flow rate Q of the dry air when $v_1/v_2=S_2/S_1=10$, the absolute humidity $u(x)$ at a condition of $x<l_{Lt2}$ is lower than the saturated absolute humidity $u_{t1}$ and the saturated absolute humidity $u_{t2}$. Therefore, neither the member 200 nor the member 201 suffers condensation. Further, if a condition of Q=0.1, $Pe_1$=−300, $Pe_2$=−20 is set by increasing the flow rate Q of the dry air, the absolute humidity $u(x)$ at a condition of $x<l_{Lt2}$ becomes lower than the saturated absolute humidity $u_{t2}$. Thus, neither the member 200 nor the member 201 suffers condensation.

As stated above, to suppress the condensation on both the member 200 and the member 201 when $v_1/v_2=S_2/S_1=10$, it is desirable to set the flow rate Q of the dry air to be equal to or higher than 0.01 (Q≥0.01).

In addition, as shown in FIG. 7, for example, if Q equals 0.001, $Pe_1$ equals −3 and $Pe_2$ equals −0.02 (Q=0.001, $Pe_1$=

-3, $Pe_2=-0.02$) when $v_1/v_2=S_2/S_1=100$, the absolute humidity $u(x)$ at the condition of $x<l_{Lt1}$ is lower than the saturated absolute humidity $u_{t1}$. Therefore, no condensation occurs on the member 200. Meanwhile, the absolute humidity $u(l_{Lt2})$ when $x=l_{Lt2}$ is higher than the saturated absolute humidity $u_{t2}$. In the example of FIG. 7, the absolute humidity $u(x)$ is found to be higher than the saturated absolute humidity $u_{t2}$ at any position of the member 201. Therefore, if Q equals 0.001, $Pe_1$ equals -3 and $Pe_2$ equals -0.02 (Q=0.001, $Pe_1$= -3, $Pe_2=-0.02$) when $v_1/v_2=S_2/S_1=100$, the condensation occurs on the member 201 though no condensation occurs on the member 200.

As another example, if the condition of Q=0.01, $Pe_1=-30$, $Pe_2=-0.2$ is set by increasing the flow rate Q of the dry air when $v_1/v_2=S_2/S_1=100$, the absolute humidity $u(x)$ at the condition of at least $x=l_{Lt2}$ is higher than the saturated absolute humidity $u_{t2}$. Therefore, at least a part of the member 201 suffers condensation. Further, if the condition of Q=0.1, $Pe_1=-300$, $Pe_2=-2$ is set by increasing the flow rate Q of the dry air, the absolute humidity $u(x)$ at the condition of $x<l_{Lt2}$ becomes lower than the saturated absolute humidity $u_{t2}$ at any position of the member 201. Thus, neither the member 200 nor the member 201 suffers condensation.

As can be clearly seen from FIG. 6 and FIG. 7, if the absolute humidity $u(x)$ is lower than the saturated absolute humidity $u_{t1}$ under the condition of $x=l_{Lt1}$ and the absolute humidity $u(x)$ is lower than the saturated absolute humidity $u_{t2}$ under the condition of $x=l_{Lt2}$, neither the member 200 nor the member 201 suffer condensation.

However, since generation of dry air incurs cost, it is desirable to minimize the consumption amount of the dry air. In the example of FIG. 6, if the flow rate Q of the dry air equals 0.01 (Q=0.01), neither the member 200 nor the member 201 suffers condensation. Therefore, it is enough to set the flow rate Q to be 0.01, and if the flow rate Q is over 0.01, unnecessary consumption of the dry air may occur. Thus, according to the present exemplary embodiment, the flow rate Q of the dry air is controlled to be minimized within a range where no condensation occurs within the first closed space 4a and the second closed space 4b.

[Specifying Method of Flow Rate Q of Dry Air]

Figure 8:
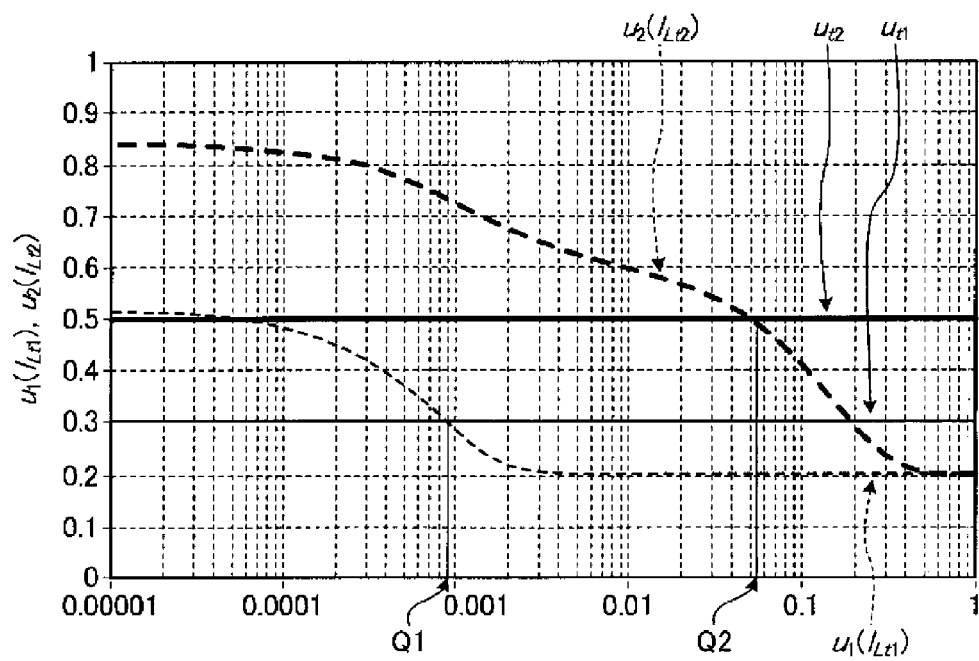
FIG. 8 is a diagram showing an example of a variation of the absolute humidity with respect to a flow rate of dry air.

Based on the aforementioned Expression (4), the control unit 60 calculates the absolute humidity $u_1(l_{Lt1})$ within the first closed space 4a under the condition of $x=l_{Lt1}$ and the absolute humidity $u_2(l_{Lt2})$ within the second closed space 4b under the condition of $x=l_{Lt2}$ when the flow rate Q of the dry air is changed. Variations of the absolute humidities $u_1(l_{Lt1})$ and $u_2(l_{Lt2})$ with respect to the flow rate Q of the dry air are illustrated in FIG. 8, for example. FIG. 8 is a diagram illustrating a variation of the absolute humidity with respect to the flow rate Q of the dry air.

Based on the temperature measured by the temperature sensor 24a provided within the first closed space 4a, the control unit 60 calculates the saturated absolute humidity $u_{t1}$ at the measured temperature. Then, the control unit 60 specifies a flow rate Q1 of the dry air at which the value of the absolute humidity $u_1(l_{Lt1})$ and the value of the saturated absolute humidity $u_{t1}$ are same. In the example of FIG. 8, the flow rate Q1 of the dry air at which the absolute humidity $u_1(l_{Lt1})$ and the saturated absolute humidity $u_{t1}$ have the same value is about 0.0009.

Further, based on the temperature measured by the temperature sensor 24b provided within the second closed space 4b, the control unit 60 calculates the saturated absolute humidity $u_{t2}$ at the measured temperature. Then, the control unit 60 specifies a flow rate Q2 of the dry air at which the value of the absolute humidity $u_2(l_{Lt2})$ and the value of the saturated absolute humidity $u_{t2}$ are same. In the example of FIG. 8, the flow rate Q2 of the dry air at which the absolute humidity $u_2(l_{Lt2})$ and the saturated absolute humidity $u_{t2}$ have the same value is about 0.055.

Of the flow rates Q1 and Q2, the control unit 60 specifies the larger value as the flow rate Q of the dry air. In the example of FIG. 8, the flow rate Q2 is specified as the flow rate Q of the dry air. Then, the control unit 60 controls the flow rate controller 21 based on the specified flow rate Q. As a result, in the processing apparatus 10, the generation of condensation within the first closed space 4a and the second closed space 4b can be suppressed, and the consumption amount of the dry air can be reduced.

[Flow Rate Control Over Dry Air]

Figure 9:
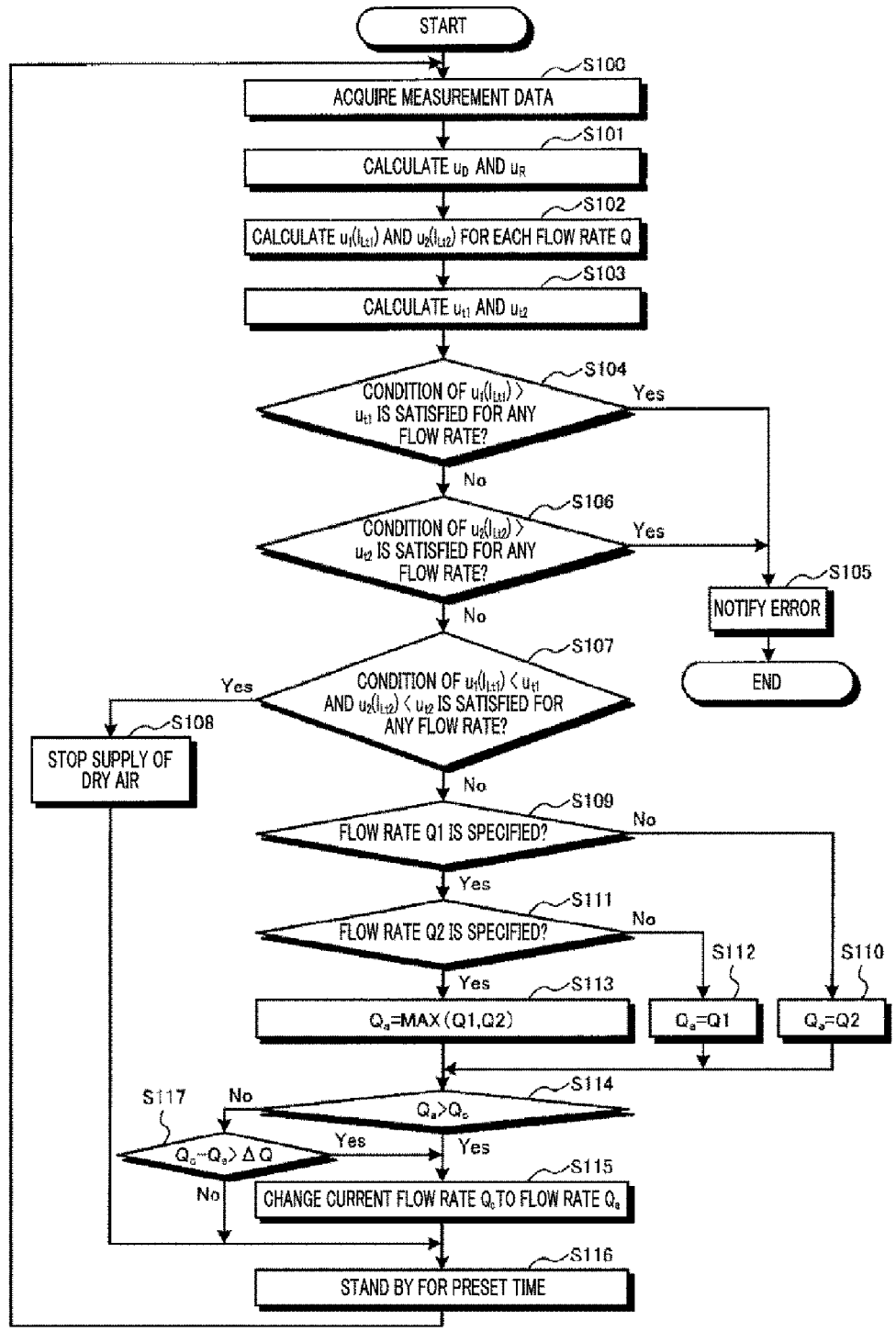
FIG. 9 is a flowchart showing an example of a flow rate control over the dry air.

FIG. 9 is a flowchart illustrating an example of a flow rate control over the dry air. If an operation of the chiller unit is begun, the processing apparatus 10 starts processings shown in the flowchart of FIG. 9. Operations shown in the flowchart of FIG. 9 are mostly performed by the control unit 60.

First, the control unit 60 acquires measurement data obtained by the various sensors (process S100). To elaborate, the control unit 60 acquires measurement data of the surface temperature of the member within the first closed space 4a measured by the temperature sensor 24a and the surface temperature of the member within the second closed space 4b measured by the temperature sensor 24b. Further, the control unit 60 acquires measurement data of the temperature and the humidity of the dry air obtained by the sensor 23 and the temperature and the humidity of the air outside the processing apparatus 10 measured by the sensor 27.

Then, based on the measurement data of the temperature and the humidity of the dry air measured by the sensor 23, the control unit 60 calculates the absolute humidity $u_D$ of the dry air (process S101). Further, based on the measurement data of the temperature and the humidity of the air outside the processing apparatus 10 measured by the sensor 27, the control unit 60 calculates the absolute humidity $u_R$ of the air outside the processing apparatus 10 (process S101).

Subsequently, based on the aforementioned Expression (4), the control unit 60 calculates the absolute humidities $u_1(l_{Lt1})$ and $u_2(l_{Lt2})$ for each flow rate Q of the dry air (process S102). The variation of the absolute humidities $u_1(l_{Lt1})$ and $u_2(l_{Lt2})$ with respect to the flow rate Q of the dry air is as illustrated in FIG. 8, for example. The process S102 is an example of a first process and a fourth process.

Thereafter, the control unit 60 calculates the saturated absolute humidity $u_{t1}$ at the surface temperature of the member within the first closed space 4a measured by the temperature sensor 24a (process S103). Further, the control unit 60 calculates the saturated absolute humidity $u_{t2}$ at the surface temperature of the member within the second closed space 4b measured by the temperature sensor 24b (process S103). The process S103 is an example of a second process and a fifth process.

Then, based on the absolute humidity $u_1(l_{Lt1})$ obtained in the process S102 and the saturated absolute humidity $u_{t1}$ obtained in the process S103, the control unit 60 specifies, for the first closed space 4a, the flow rate $Q_1$ of the dry air at which the value of the absolute humidity $u_1(l_{Lt1})$ and the value of the saturated absolute humidity $u_{t1}$ become equal to each other. However, the flow rate Q1 of the dry air at which the value of the absolute humidity $u_1(l_{Lt1})$ becomes equal to the value of the saturated absolute humidity $u_{t1}$ is not specified if the value of the saturated absolute humidity $u_{t1}$ is larger than the value of the absolute humidity $u_1(l_{Lt1})$ at any flow rate Q of the dry air. Likewise, the flow rate Q1 of the dry air at which the value of the absolute humidity $u_1(l_{Lt1})$ becomes equal to the value of the saturated absolute humidity $u_{t1}$ is not specified if the value of the saturated absolute humidity $u_{t1}$ is smaller than the value of the absolute humidity $u_1(l_{Lt1})$ at any flow rate Q of the dry air. Especially, if the value of the saturated absolute humidity $u_{t1}$ is smaller than the value of the absolute humidity $u_1(l_{Lt1})$ at any flow rate Q of the dry air, it is difficult to suppress the condensation within the first closed space 4a even if the flow rate Q of the dry air is increased. In this case, the control unit 60 notifies a manger of the processing apparatus 10 or the like of an error. For the case where the value of the saturated absolute humidity $u_{t1}$ becomes smaller than the value of the absolute humidity $u_1(l_{Lt1})$ at any flow rate Q of the dry air, it may be assumed that the dryer 22 or the like is broken, for example. This is the same for the second closed space 4b.

That is, the control unit 60 determines whether the condition that the absolute humidity $u_1(l_{Lt1})$ is larger than the saturated absolute humidity $u_{t1}(u_1(l_{Lt1})>u_{t1})$ is satisfied for any flow rate Q of the dry air (process S104). If the condition of the absolute humidity $u_1(l_{Lt1})>$the saturated absolute humidity $u_{t1}$ is met for any flow rate Q of the dry air (S104: Yes), the condensation occurs within the first closed space 4a whichever value the flow rate Q of the dry air is adjusted to have. In this case, the control unit 60 notifies the manager of the processing apparatus 10 or the like of the error (process S105), and the processing shown in the flowchart of FIG. 9 is terminated.

Meanwhile, if the condition of the absolute humidity $u_1(l_{Lt1})>$the saturated absolute humidity $u_{t1}$ is not satisfied for at least one flow rate Q of the dry air (S104: No), the control unit 60 determines whether the condition that the absolute humidity $u_2(l_{Lt2})$ is larger than the saturated absolute humidity $u_{t2}(u_2(l_{Lt2})>u_{t2})$ is satisfied for any flow rate Q of the dry air (process S106). If the condition of the absolute humidity $u_2(l_{Lt2})>$the saturated absolute humidity $u_{t2}$ is met for any flow rate Q of the dry air (S106: Yes), the processing shown in the process S105 is performed since the condensation occurs in the second closed space 4b whichever value the flow rate Q of the dry air is adjusted to have.

Meanwhile, if the condition of the absolute humidity $u_2(l_{Lt2})>$the saturated absolute humidity $u_{t2}$ is not satisfied for at least one flow rate Q of the dry air (S106: No), the control unit 60 performs a processing shown in a process S107. That is, the control unit 60 determines whether the absolute humidity $u_1(l_{Lt1})$ is smaller than the saturated absolute humidity $u_{t1}(u_1(l_{Lt1})<u_{t1})$ and the absolute humidity $u_2(l_{Lt2})$ is smaller than the saturated absolute humidity $u_{t2}(u_2(l_{Lt2})<u_{t2})$ for any flow rate Q of the dry air (process S107). If the value of the saturated absolute humidity $u_{t1}$ is larger than value of the absolute humidity $u_1(l_{Lt1})$ for any flow rate Q of the dry air, the condensation does not occur in the first closed space 4a. Thus, the flow rate Q1 of the dry air can be set to be zero. Further, if the value of the saturated absolute humidity $u_{t2}$ is larger than value of the absolute humidity $u_2(l_{Lt2})$ for any flow rate Q of the dry air, the condensation does not occur in the second closed space 4b. Thus, the flow rate Q2 of the dry air can be set to be zero.

If the condition of the absolute humidity $u_1(l_{Lt1})<$the saturated absolute humidity $u_{t1}$ and the absolute humidity $u_2(l_{Lt2})<$the saturated absolute humidity $u_{t2}$ is satisfied for any flow rate Q of the dry air (S107: Yes), the control unit 60 performs a processing shown in a process S108. That is, the control unit 60 controls the flow rate controller 21 to stop the supply of the dry air (process S108). Then, a processing shown in a process S116 is performed.

Further, in the process S108, the flow rate of the dry air may not be set to be zero, but the dry air may be supplied into the first closed space 4a at a minute flow rate. In this case, when increasing the flow rate of the dry air in a subsequent process, the gas within the first closed space 4a and the second closed space 4b may be exhausted more rapidly, so that the absolute humidities of the gas within the first closed space 4a and the second closed space 4b can be reduced more rapidly.

If the condition of the absolute humidity $u_1(l_{Lt1})<$the saturated absolute humidity $u_{t1}$ or the condition of the absolute humidity $u_2(l_{Lt2})<$the saturated absolute humidity $u_{t2}$ is not satisfied for any one flow rate Q of the dry air (S107: No), the control unit 60 performs a processing shown in a process S109. If the determination of NO is made in the process S107, at least one of the flow rates Q1 and Q2 of the dry air is specified.

Subsequently, the control unit 60 determines whether the flow rate Q1 of the dry air is specified (S109). If the flow rate Q1 of the dry air is not specified (S109: No), the condensation does not occur within the first closed space 4a at any flow rate of the dry air. Further, in this case, the flow rate Q2 of the dry air is specified. Thus, if the flow rate Q of the dry air is equal to or larger than the flow rate Q2, the condensation occurs neither in the first closed space 4a nor in the second closed space 4b. The control unit 60 specifies the flow rate Q2 as a target flow rate $Q_a$ of the dry air (process S110). Then, a processing shown in a process S114 is performed.

If the flow rate Q1 of the dry air is specified (S109: Yes), the control unit 60 determines whether the flow rate Q2 of the dry air is specified (process S111). If the flow rate Q2 of the dry air is not specified (S111: No), the condensation does not occur within the second closed space 4b at any flow rate of the dry air. Thus, if the flow rate Q of the dry air is equal to or larger than the flow rate Q1, the condensation occurs neither in the first closed space 4a nor in the second closed space 4b. The control unit 60 specifies the flow rate Q1 as the target flow rate $Q_a$ of the dry air (process S112). Then, the processing shown in the process S114 is performed.

If the flow rate Q2 of the dry air is specified (S111: Yes), the control unit 60 specifies, as the target flow rate $Q_a$ of the dry air, the flow rate Q1 or the flow rate Q2, whichever is larger (process S113). Then, the control unit 60 determines whether the target flow rate $Q_a$ of the dry air is larger than a current flow rate $Q_c$ (process S114).

If the target flow rate $Q_a$ of the dry air is larger than the current flow rate $Q_c$ (S114: Yes), the control unit 60 controls the flow rate controller 21 to change the current flow rate $Q_c$ of the dry air to the target flow rate $Q_a$ (S115). The process S115 is an example of a third process. Then, the control unit 60 stands by for a preset time (for example, several seconds) until the flow of the gas within the first closed space 4a and the second closed space 4b is stabilized (S116), and then, resumes the processing shown in the process S100.

Meanwhile, if the target flow rate $Q_a$ of the dry air is equal to or less than the current flow rate $Q_c$ (S114: No), the control unit 60 determines whether a difference between the target flow rate $Q_a$ and the current flow rate $Q_c$ of the dry air is larger than a preset threshold value $\Delta Q$ (process S117). If the difference between the target flow rate $Q_a$ and the current flow rate $Q_c$ of the dry air is larger than the preset threshold value $\Delta Q$ (S117: Yes), the processing shown in the process S115 is performed. Meanwhile, if the difference between the target flow rate $Q_a$ and the current flow rate $Q_c$ of the dry air is equal to or less than the preset threshold value $\Delta Q$ (S117: No), the processing shown in the process S116 is performed.

As stated above, if the target flow rate $Q_a$ of the dry air is larger than the current flow rate $Q_c$ thereof, the current flow rate $Q_c$ of the dry air is immediately changed to the target flow rate $Q_a$, so that the condensation within the first closed space 4a and the second closed space 4b is suppressed. Further, even if the target flow rate $Q_a$ of the dry air is equal to or less than the current flow rate $Q_c$, the flow rate of the dry air is not changed when the difference between the target flow rate $Q_a$ and the current flow rate $Q_c$ is equal to or less than the threshold value $\Delta Q$. In this way, the condensation that might be caused by an excessive decrease of the dry air due to a measurement error of each sensor can be suppressed. Further, if the target flow rate $Q_a$ of the dry air is equal to or less than the current flow rate $Q_c$, the current flow rate $Q_c$ may be immediately changed to the target flow rate $Q_a$.

Further, the above exemplary embodiment has been described for the case where the flow rate Q1 is not specified if the value of the saturated absolute humidity $u_{t1}$ calculated in the process S103 is larger than the value of the absolute humidity $u_1(l_{Lt1})$ calculated in the process S102 at any flow rate Q of the dry air. However, the exemplary embodiment is not limiting. Since the condensation does not occur within the first closed space 4a if the value of the saturated absolute humidity $u_{t1}$ is larger than the value of the absolute humidity $u_1(l_{Lt1})$ at any flow rate Q of the dry air, the control unit 60 may carry out the processing while assuming that the flow rate Q1 is set to be zero. In this case, the processes S107 and S108 may be omitted. Likewise, if the value of the saturated absolute humidity $u_{t2}$ calculated in the process S103 is larger than the absolute humidity $u_2(l_{Lt2})$ calculated in the process S102 at any flow rate Q of the dry air, the control unit 60 may carry out the processing while assuming that the flow rate Q2 is set to be zero.

In the above, the exemplary embodiment has been described. According to the processing apparatus 1 of the present exemplary embodiment, the condensation on the members within the processing apparatus 10 can be suppressed, and the consumption amount of the dry air can be suppressed. Particularly, if the set temperature in the processing condition for the semiconductor wafer W is variable, it is possible to set the flow rate of the dry air appropriately based on the temperature variation of the members caused by the change in the set temperature. Therefore, the consumption amount of the dry air can be minimized.

(Others)

Once again, the exemplary embodiment is not limiting, and various changes and modifications may be made within the scope of the present disclosure.

By way of example, in the above-described exemplary embodiment, the control unit 60 calculates the absolute humidities $u_1(l_{Lt1})$ and $u_2(l_{Lt2})$ for each flow rate Q every time in the process S102, the present disclosure is not limited thereto. For example, previously calculated values of the absolute humidities $u_1(l_{Lt1})$ and $u_2(l_{Lt2})$ for each flow rate Q may be stored in the memory of the control unit 60 for each combination of the absolute humidities $u_D$ and $u_R$. In this case, in the process S102, the control unit 60 reads out the values of the absolute humidities $u_1(l_{Lt1})$ and $u_2(l_{Lt2})$ for each flow rate Q corresponding to a combination of the absolute humidities $u_D$ and $u_R$ calculated in the process S101 from the memory. Thus, a processing load upon the control unit 60 can be reduced.

Moreover, in the above-described exemplary embodiment, the flow rate Q of the dry air is controlled such that the condensation does not occur in the first closed space 4a and the second closed space 4b. However, the present disclosure is not limited thereto. For example, since the second closed space 4b is relatively larger than the first closed space 4a, it may be considered to cover a member likely to have a low temperature within the second closed space 4b with an insulator. In this case, the flow rate Q of the dry air may be controlled such that the condensation does not occur in the first closed space 4a. That is, the flow rate Q of the dry air may be controlled such that the condensation does not occur for the single closed space.

Furthermore, in the above-describe exemplary embodiment, the flow rate of the dry air is controlled to suppress the condensation on each of the members within both the first closed space 4a and the second closed space 4b which communicate with each other. However, the exemplary embodiment is not limited thereto. By way of example, the present disclosure may be applied to more than three closed spaces which communicate with each other.

In addition, the above exemplary embodiment has been described for the chamber 1 having the structure in which the flow of the processing gas is axisymmetric with respect to the central axis of the semiconductor wafer W. However, the exemplary embodiment is not limited thereto. By way of example, the present disclosure may be applied to a chamber, as a general chamber for use in a semiconductor processing, having a closed space in which a member which becomes to have a temperature lower than the room temperature is exposed.

Moreover, in the above-described exemplary embodiment, the flow rate of the dry air is controlled based on dimensions and sizes of the individual components of the chamber 1 which are previously designed. However, the exemplary embodiment is not limited thereto, and the flow rate of the dry air supplied into the closed space may be fixed, and the chamber 1 may be designed to have a closed space within a range where the condensation does not occur at the fixed flow rate of the supplied dry air.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A condensation suppressing method in a processing apparatus configured to process a processing target object, wherein the processing apparatus comprises:
    a first temperature measuring unit configured to measure a surface temperature of a first member exposed in a first closed space provided in the processing apparatus;
    a supply line through which a low-dew point gas having a dew point temperature lower than that of air outside the processing apparatus is supplied into the first closed space; and
    a control unit configured to control a flow rate of the low-dew point gas supplied into the first closed space, and wherein the control unit performs:

a first process of specifying an absolute humidity of a gas within the first closed space at a position of a surface of the first member for the flow rate of the low-dew point gas;

a second process of specifying a saturated absolute humidity at the surface temperature of the first member measured by the first temperature measuring unit; and a third process of controlling the flow rate of the low-dew point gas based on the absolute humidity of the gas within the first closed space at the position of the surface of the first member and the saturated absolute humidity at the surface temperature of the first member.

2. The condensation suppressing method of claim 1, wherein, in the third process, the flow rate of the low-dew point gas is controlled to be larger than a first flow rate at which the absolute humidity of the gas within the first closed space at the position of the surface of the first member becomes equal to the saturated absolute humidity at the surface temperature of the first member, and the flow rate of the low-dew point gas is also controlled such that a difference between the flow rate of the low-dew point gas and the first flow rate is equal to or less than a preset value.

3. The condensation suppressing method of claim 1, wherein the first member is a member, which becomes to have the lowest temperature, of members exposed within the first closed space.

4. The condensation suppressing method of claim 1, wherein the processing apparatus further comprises a second temperature measuring unit configured to measure a surface temperature of a second member exposed within a second closed space provided in the processing apparatus, the first closed space and the second closed space communicate with each other, the low-dew point gas supplied into the first closed space from the supply line is exhausted through the second closed space, and wherein the control unit further performs:

a fourth process of specifying an absolute humidity of a gas within the second closed space at a position of a surface of the second member for the flow rate of the low-dew point gas; and a fifth process of specifying a saturated absolute humidity at the surface temperature of the second member measured by the second temperature measuring unit, and wherein, in the third process, the flow rate of the low-dew point gas is controlled based on the absolute humidity of the gas within the first closed space at the position of the surface of the first member, the saturated absolute humidity at the surface temperature of the first member, the absolute humidity of the gas within the second closed space at the position of the surface of the second member and the saturated absolute humidity at the surface temperature of the second member.

5. The condensation suppressing method of claim 4, wherein, in the third process, the flow rate of the low-dew point gas is controlled to be larger than the first flow rate at which the absolute humidity of the gas within the first closed space at the position of the surface of the first member becomes equal to the saturated absolute humidity at the surface temperature of the first member or a second flow rate at which the absolute humidity of the gas within the second closed space at the position of the surface of the second member becomes equal to the saturated absolute humidity at the surface temperature of the second member, whichever is larger, and the flow rate of the low-dew point gas is also controlled such that a difference between the flow rate of the low-dew point gas and the first flow rate or the second flow rate, whichever is larger, is equal to or less than a preset value.

6. The condensation suppressing method of claim 4, wherein the second member is a member, which becomes to have the lowest temperature, of members exposed within the second closed space.

7. A processing apparatus configured to process a processing target object, comprising:

a first temperature measuring unit configured to measure a surface temperature of a first member exposed in a first closed space provided in the processing apparatus;

a supply line through which a low-dew point gas having a dew point temperature lower than that of air outside the processing apparatus is supplied into the first closed space; and a control unit configured to control a flow rate of the low-dew point gas supplied into the first closed space, wherein the control unit performs:

specifying an absolute humidity of a gas within the first closed space at a position of a surface of the first member for the flow rate of the low-dew point gas;

specifying a saturated absolute humidity at the surface temperature of the first member measured by the first temperature measuring unit; and controlling the flow rate of the low-dew point gas based on the absolute humidity of the gas within the first closed space at the position of the surface of the first member and the saturated absolute humidity at the surface temperature of the first member.

* * * * *